(12) United States Patent
Itoh et al.

(10) Patent No.: US 7,735,040 B2
(45) Date of Patent: Jun. 8, 2010

(54) METHOD FOR DESIGNING CELL LAYOUT OF A SEMICONDUCTOR INTEGRATED CIRCUIT WITH LOGIC HAVING A DATA FLOW

(75) Inventors: Katsuyuki Itoh, Hadano (JP); Hironori Iwamoto, Hadano (JP)

(73) Assignee: Hitachi, Ltd., Tokyo (JP)

( * ) Notice: Subject to any disclaimer, the term of this patent is extended or adjusted under 35 U.S.C. 154(b) by 507 days.

(21) Appl. No.: 11/624,788

(22) Filed: Jan. 19, 2007

(65) Prior Publication Data

US 2007/0186201 A1 Aug. 9, 2007

(30) Foreign Application Priority Data

Jan. 20, 2006 (JP) ............................. 2006-012692

(51) Int. Cl.
*G06F 17/50* (2006.01)
(52) U.S. Cl. .......................................................... 716/8
(58) Field of Classification Search ................ 716/8–10
See application file for complete search history.

(56) References Cited

U.S. PATENT DOCUMENTS

2003/0115564 A1* 6/2003 Chang et al. .................... 716/8

FOREIGN PATENT DOCUMENTS

JP 2000-250964 9/2000

* cited by examiner

*Primary Examiner*—Stacy A Whitmore
(74) *Attorney, Agent, or Firm*—Antonelli, Terry, Stout & Kraus, LLP.

(57) ABSTRACT

With a conventional method for designing cell layout, it is necessary to give relative positional information in advance to all cells to be arranged. Furthermore, the method is troublesome because it is necessary to correct relative positional information of cells after confirming a result of temporary layout. Therefore, it takes time to obtain a layout result.

The present invention extracts cells of a specific type specified from outside or cells satisfying specific conditions, arranges these specific cells first or limits a layout position by specifying a layout position, then arranges the remaining cells using a general layout algorithm.

6 Claims, 7 Drawing Sheets

| No. | NAME | ARRANGED /NOT ARRANGED | COORDINATE | | CELL WIDTH | CELL HEIGHT | SUBSE- QUENT TARGET CELL NUMBER | NUMBER OF CONNECTED CELL | | | |
|---|---|---|---|---|---|---|---|---|---|---|---|
| | | | X | Y | | | | TOP | BOT- TOM | LEFT | RIGHT |
| 1 | cell1 | ARRANGED | 4538 | 5432 | 15 | 15 | −1 | — | — | — | 2 |
| 2 | cell2 | ARRANGED | 4553 | 5442 | 15 | 5 | 3 | — | 3 | 1 | × |
| 3 | cell3 | ARRANGED | 4559 | 5437 | 7 | 5 | 4 | 2 | — | 4 | × |
| 4 | cell4 | ARRANGED | 4553 | 5437 | 6 | 5 | 5 | — | 5 | × | 3 |
| 5 | cell5 | ARRANGED | 4553 | 5432 | 18 | 5 | 6 | 4 | — | × | — |
| 6 | cell6 | NOT ARRANGED | — | — | 3 | 5 | 7 | — | — | — | — |
| 7 | cell7 | NOT ARRANGED | — | — | 9 | 5 | −1 | — | — | — | — |
| ⋮ | ⋮ | ⋮ | ⋮ | ⋮ | ⋮ | ⋮ | ⋮ | ⋮ | ⋮ | ⋮ | ⋮ |

1401

| No. | NUMBER OF CELL TARGETED FOR LAYOUT | STARTING NUMBER OF CELL TO BE ARRANGED | LIMIT OF LAYOUT AREA WIDTH |
|---|---|---|---|
| 1 | 1 | 2 | 40 |
| 2 | 6 | 7 | 40 |
| ⋮ | ⋮ | ⋮ | ⋮ |

METHOD FOR DESIGNING CELL LAYOUT OF A SEMICONDUCTOR INTEGRATED CIRCUIT WITH LOGIC HAVING A DATA FLOW

BACKGROUND OF THE INVENTION

The present invention relates to a method for designing cell layout and a cell layout design program of semiconductor integrated circuit. More particularly, the present invention relates to a method for designing cell layout and a cell layout design program which obtain a layout result satisfying a circuit delay restriction, in a short time period with a little piece of command information.

In a conventional method for designing cell layout of semiconductor integrated circuit, it has been important that delay be considered in layout processing. Particularly, as a method for designing cell layout with a logic having a data flow (hereinafter referred to as data path), for example, a technique disclosed in Japan Patent Laid-open No. 2000-250964 is known. This conventional technique groups cells using the same arrangement information as a key by giving in advance relative positional information to each cell, and temporarily arranges cells of the same group in a specified order. Subsequently, the technique vertically or horizontally moves the above-mentioned temporarily arranged cells to array them, thus reducing the wiring length to satisfy the delay restriction.

SUMMARY OF THE INVENTION

The above-mentioned method for designing cell layout disclosed in Japan Patent Laid-open No. 2000-250964 is troublesome and takes time to obtain a required layout result because it is necessary to give in advance relative positional information to all cells to be arranged and repeatedly correct the relative positional information of cells several times after confirming a result of temporary layout.

In order to solve the above-mentioned subject, an object of the present invention is to obtain a layout result satisfying the delay restriction in a short time period with a little piece of command information, by arranging only specific type of cells first in consideration of a data flow and then the remaining cells in consideration of the relationship with the specific type of cells without giving in advance positional information to the priority cells.

As a method for designing cell layout in layout design of semiconductor integrated circuit, the present invention is characterized, particularly for a logic having a data flow, in that specific cells which can be specified from outside (hereinafter referred to as priority cells) are arranged first so as to fill a layout area width specified from outside and then the remaining cells are arranged by use of a general layout algorithm.

In accordance with the present invention, a layout result satisfying the circuit delay restriction can be obtained in a short time based on a little piece of command information given in advance, in a logic such as a data path.

DESCRIPTION OF THE PREFERRED EMBODIMENTS

Embodiments will be described in detail below with reference to the accompanying drawings.

Embodiment 1

Detailed information and processing in the present embodiment will be described below with reference to FIG. 1 and FIG. 2.

Figure 1:
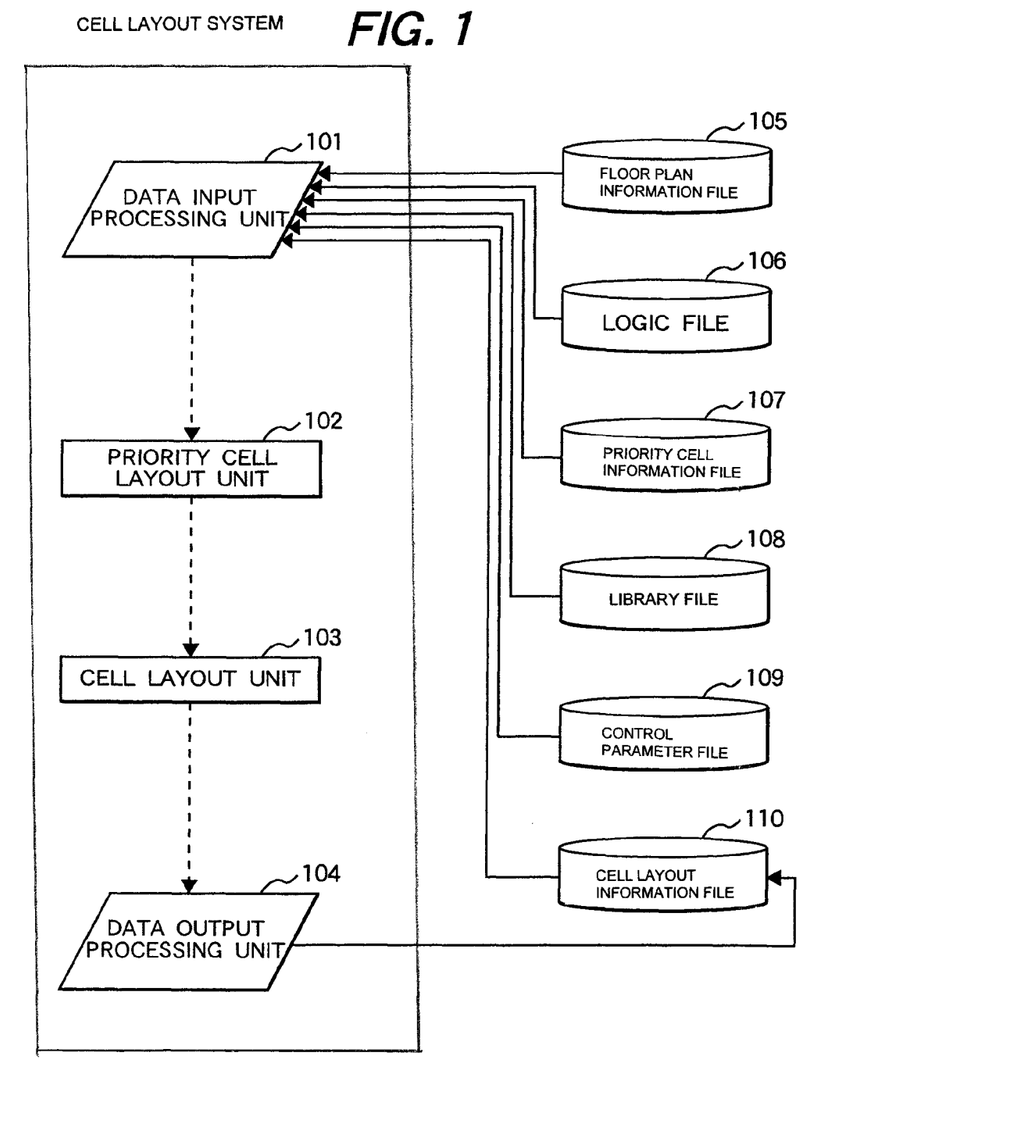
FIG. 1 is a block diagram of a cell layout system of semiconductor integrated circuit according to an embodiment of the present invention.

FIG. 1 is a diagram showing a configuration of a cell layout system of semiconductor integrated circuit concerning the present invention. Floor plan information file 105 is a data file having a floor plan of a target logic circuit. A logic file 106 is a data file which includes a block of the target logic circuit, logical connection between cells, signal name, etc. Priority cell information file 107 is an information file which specifies a set of key cells in a logic to be processed. A library file 108 is an information file which stores information about cell shape, pin position, cell delay time, etc. A control parameter file 109 is an information file about a limit of the width of a layout area in which priority cells are to be arranged. Cell layout information file 110 is an information file about layout position of arranged cells. The floor plan information file 105, the logic file 106, the priority cell information file 107, the library file 108, the control parameter file 109, and the cell layout information file 110 are inputted into a data input processing unit 101. A priority cell layout unit 102 arranges priority cells by use of the priority cell information file 107. A cell layout unit 103 arranges cells other than priority cells by use of a conventional general method for designing cell layout. A data output processing unit 104 outputs and updates the cell layout information to the cell layout information file 110 as a processing result.

Figure 2:
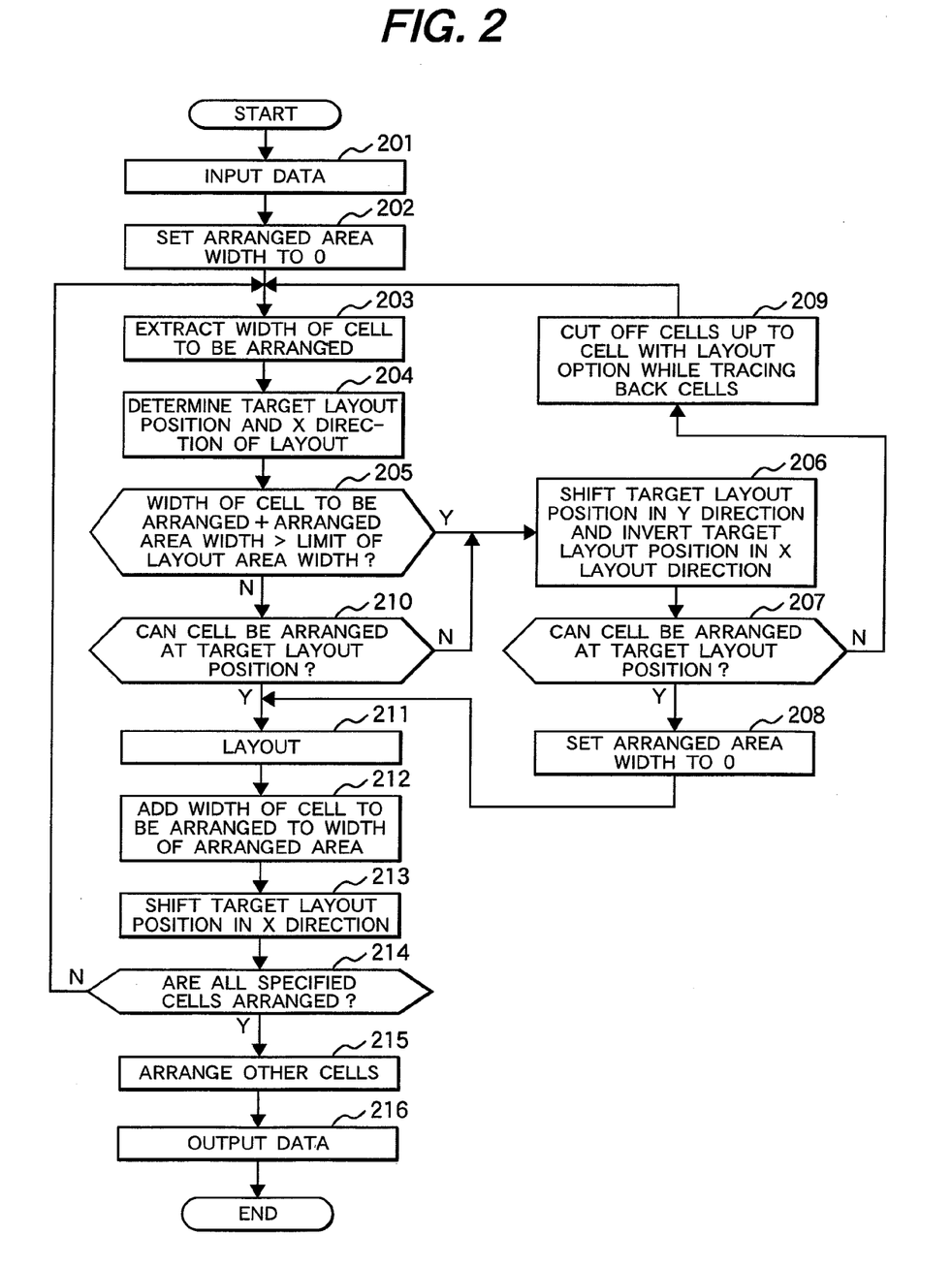
FIG. 2 is a flow chart showing an embodiment of processing procedure in the cell layout system of semiconductor integrated circuit.

FIG. 2 is a diagram showing a processing flow of a processing procedure for the cell layout system shown in FIG. 1 for providing a cell layout for a semiconductor integrated circuit in accordance with the present invention.

Firstly, in accordance with the processing procedure, Step 201 inputs data and then sets the priority cell information, general cell information, and a width limit of a layout area in which priority cells are to be arranged. Step 201 reads a data flow from the logic file 106 to determine the order of cell layout. Then, Step 202 initializes the arranged area width to zero. Subsequently, Step 203 extracts the width of a cell to be arranged. Then, Step 204 determines a target layout position of cells to be arranged, and the X direction of layout of cells to be arranged. Step 205 compares the total of the arranged area width and the width of cell to be arranged with the above-mentioned limit of layout area width. If the former is larger than the latter, Step 206 shifts the target layout position in the Y direction and inverts the X direction of layout; otherwise, Step 210 is performed. Step 207 determines whether a cell can be arranged in the determined target layout position. If the cell can be arranged, Step 208 is performed; otherwise, Step 209 is performed. Step 208 initializes the arranged area width to zero. Since cells cannot be arranged by shifting the Y direction of the layout target, Step 209 cuts off arranged cells while tracing back up to a priority cell at which a layout option exists. Then, from Step 203 on, processing is performed for a priority cell immediately following a cell at which a layout option exists.

As mentioned later, for example, it is possible to determine whether there is a layout option by storing a cell information table 1401 in FIG. 14 in a storage area to be accessed during processing, tracing back a subsequent target cell number, and referencing fields of numbers of connected cells. Step 210 determines whether a cell can be arranged at the target layout position determined in Step 204. If the cell cannot be arranged, Step 206 is performed. Furthermore, if the cell can be arranged, it is arranged at the target layout position in Step 211. Subsequently, Step 212 adds the width of cell to be arranged to the width of the arranged area. Then, Step 213 shifts the target layout position in the X direction by the width of cell to be arranged. The processing from Step 203 to Step 213 is repeated as long as there is any priority cell that has not been arranged. This judgment is made in Step 214. After arranging priority cells, Step 215 arranges other cells by use of a general layout algorithm. The general layout algorithm mentioned here is a mini-cut method or clustering method disclosed on pages 154 to 158 in document "Equipment Design and Implementation" published by Maruzen on Mar. 30, 1996. After performing these processes, Step 216 performs data output.

The present invention will be described in detail with reference to FIGS. 3 to 7.

Figure 3:
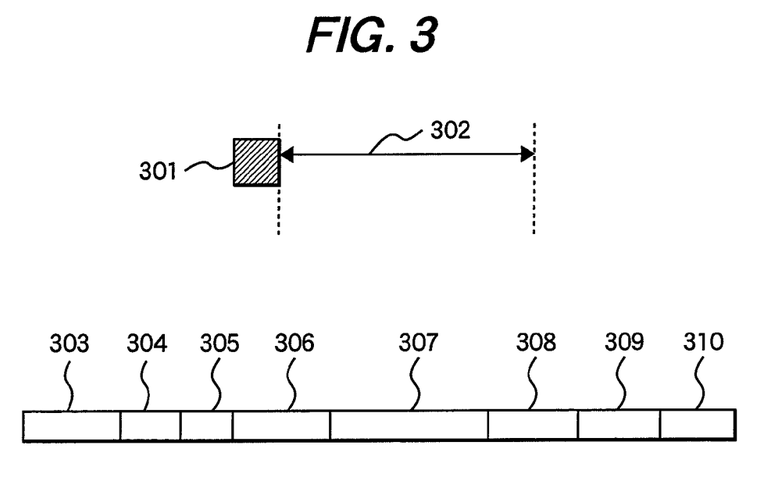
FIG. 3 is a diagram showing an embodiment of logic cells to which the method for designing cell layout of semiconductor integrated circuit according to the present invention is applied.

FIG. 3 is a diagram showing logic cells to which the method for designing cell layout of semiconductor integrated circuit according to the present invention is applied. Logic cells to be used as examples include an arranged logic cell 301 and priority cells 303, 304, 305, 306, 307, 308, 309, and 310, the priority cells being to be arranged. In order to perform layout processing in consideration of the data flow read in Step 201, it is necessary to arrange priority cells to be arranged so that a priority cell 304 comes next to a priority cell 303, 305 next to 304, 306 next to 305, 307 next to 306, 308 next to 307, 309 next to 308, and 310 next to 309. Furthermore, a cell 302 is the limit of layout area width specified by the control parameter.

Figure 4:
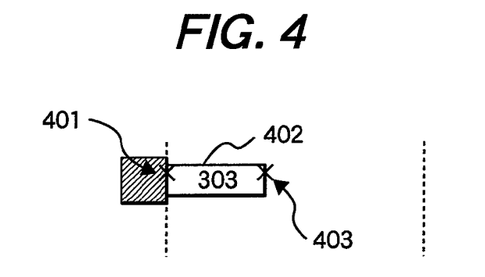
FIG. 4 is a diagram showing a condition in which a priority cell is arranged.

FIG. 4 is a diagram showing the determination of a target layout position, layout processing, and the movement of the target layout position when arranging cells to be arranged of the present invention, using the cell 303 as an example, according to the processing flow in FIG. 2. Step 202 sets a wired area width to zero. Then, Step 203 extracts the cell width of the cell 303. Then, Step 204 references the information inputted from the priority cell information file 107 and the cell layout information file 110. If a first layout target is set to the right-hand side of the arranged logic cell 301, the layout target is set to a position 401 and a target X direction of layout is set to the right. Then, Step 205 compares the total of the cell width of the cell 303 and arranged area width with the limit of layout area width. Here, since the total of the cell width and arranged area width is smaller than the limit of layout area width 302, the process proceeds to Step 210. Step 210 arranges the priority cell to be arranged 303 at a position 402 next to the target layout position 401. Subsequently, Step 212 adds the width of the cell 303 arranged at the target layout position to the wired area width. Then, Step 213 shifts the X coordinate of the target layout position to create a new target layout position 403.

Figure 5:
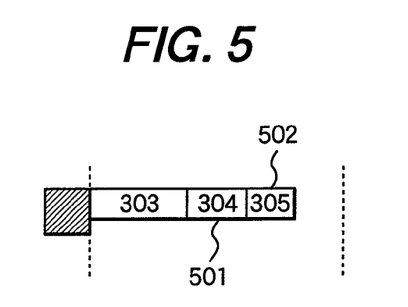
FIG. 5 is a diagram showing a condition in which priority cells are arranged.

Step 213 performs the same processing for the priority cells 304 and 305 to arrange the priority cell 304 at a layout position 501 and the priority cell 305 at a layout position 502, as shown in FIG. 5.

Figure 6:
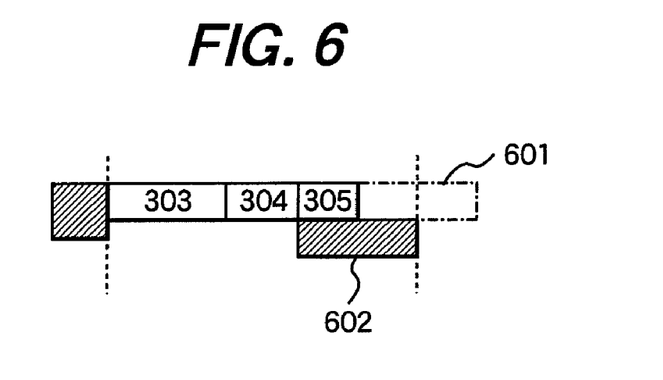
FIG. 6 is a diagram showing a condition in which priority cells are arranged.

FIG. 6 is a diagram showing an operation when the limit of layout area width is exceeded when arranging the cells to be arranged based on the processing flow shown in FIG. 2, using the cell 306 as an example, according to the present invention. The priority cells 303, 304, and 305 shown in FIG. 3 have been arranged. Then, in order to arrange the priority cell 306, the target layout position is determined and the total value of the cell width of the priority cell 306 to be arranged and arranged area width is compared with the limit of layout area width in Step 205. As a result, the total value of the arranged area width and the width of cell to be arranged exceeds the limit of layout area width. Therefore, Step 206 shifts the Y direction of the target layout position and inverts the X direction of layout. Then, Step 207 determines whether the cell 306 can be arranged at the shifted target layout position. Here, since the cell 306 can be arranged, the process proceeds to Step 208. Then, Step 208 sets the arranged area width to zero. Subsequently, Step 211 arranges the cell 306 at the target layout position.

Figure 7:
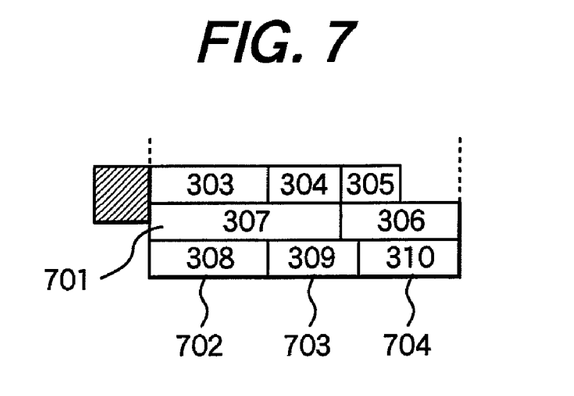
FIG. 7 is a diagram showing a condition in which priority cells are arranged.

FIG. 7 shows a condition in which all priority cells to be arranged have been arranged by performing the processing shown in FIGS. 4 to 6. The priority cell to be arranged 307 shown in FIG. 3 is arranged at a position 701 which allows the cell to be arranged next to the priority cell to be arranged 306. Since the priority cell to be arranged 308 in FIG. 3 exceeds the limit of layout area width, the target layout position is shifted in the Y direction and then the cell is arranged at a position 702. Cells 309 and 310 can be arranged at positions 703 and 704, respectively, which means that all priority cells to be arranged have been arranged.

Thus, after all priority cells have been arranged, cells other than the priority cells are arranged. Here, a popular layout method may be used.

Embodiment 2

A second embodiment of the present invention will be described below with reference to FIG. 8 to FIG. 10.

Figure 8:
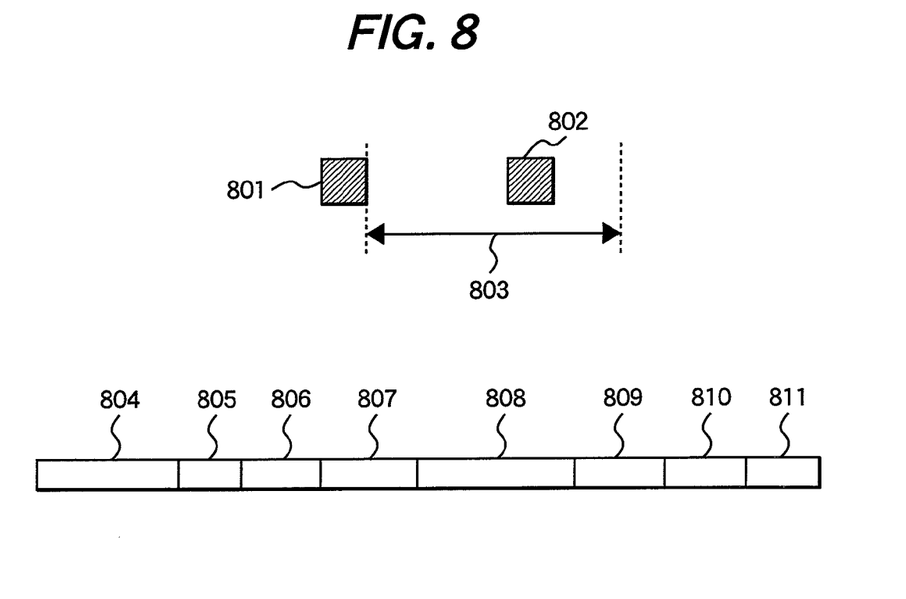
FIG. 8 is a diagram showing a second embodiment of logic cells to which the method for designing cell layout of semiconductor integrated circuit according to the present invention is applied.

FIG. 8 is a diagram showing logic cells to which the method for designing cell layout of semiconductor integrated circuit according to the present invention is applied. Logic cells to be used as examples include arranged logic cells 801 and 802 and priority cells to be arranged 804, 805, 806, 807, 808, 809, 810, and 811. In order to perform layout processing in consideration of a data flow, it is necessary to arrange priority cells to be arranged so that 805 comes next to 804, 806 next to 805, 807 next to 806, 808 next to 807, 809 next to 808, 810 next to 809, and 811 next to 810. Furthermore, a distance 803 is the limit of layout area width specified by the control parameter.

Figure 9:
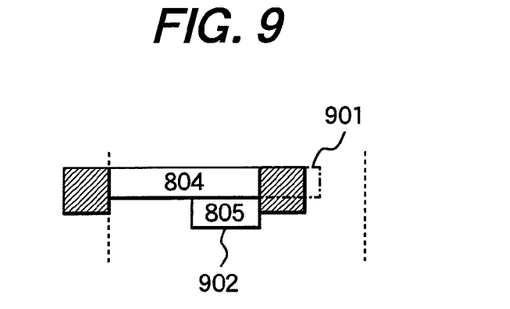
FIG. 9 is a diagram showing a condition in which priority cells are arranged.

FIG. 9 is a diagram showing a form of layout performed while avoiding an obstacle using the method for designing cell layout of semiconductor integrated circuit, according to the present invention, based on the processing flow shown in FIG. 2. The priority cell 804 has already been arranged, and the priority cell 805 is to be arranged to the right of the priority cell 804, i.e., at a position 901. Step 205 compares the total of the cell width of the cell 805 and the arranged area width with the limit of layout area width. Here, since the limit of layout area width 803 is smaller than the total, the process proceeds to Step 210. Then, Step 210 determines whether the priority cell 805 can be arranged at the target layout position. Here, since the arranged cell 802 is an obstacle that disturbs the layout, the process proceeds to Step 206. Step 206 shifts the Y direction of the layout target and inverts the X direction of layout. Then, Step 207 determines whether the cell 805 can be arranged at a shifted target layout position 902. Here, since the cell 805 can be arranged, the process proceeds to Step 208. Then, Step 208 then sets the arranged area width to zero. Subsequently, Step 211 arranges the cell 805 at the target layout position 902.

Figure 10:
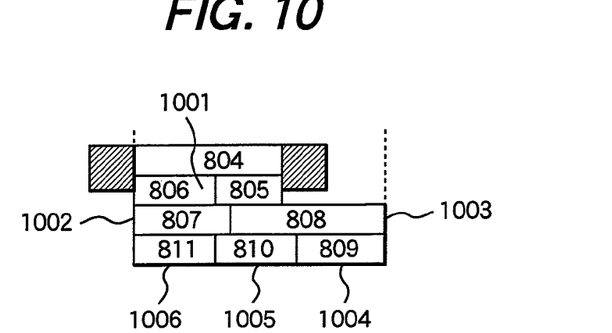
FIG. 10 is a diagram showing a condition in which priority cells are arranged.

FIG. 10 is a diagram showing all priority cells to be arranged which have been arranged using the processing flow shown in FIG. 2 according to the present invention. The priority cell to be arranged 807, as shown in FIG. 8, is to be arranged to the left of an arranged priority cell 1001. However, since the limit of layout area width is exceeded, the target layout position is shifted in the Y direction and the cell 807 is arranged at a position 1002. The priority cell 808 can be arranged at a position 1003, and the priority cell 809 cannot be arranged to the right of a position 1003 because the limit of layout area width is exceeded. Therefore, the target layout position is shifted in the Y direction and the cell 809 is arranged at a position 1004. Then, priority cells 1005 and 1006 can be arranged similarly. This means that all priority cells to be arranged have been arranged.

Embodiment 3

A third embodiment of the present invention will be described with reference to FIG. 11 to FIG. 13.

Figure 11:
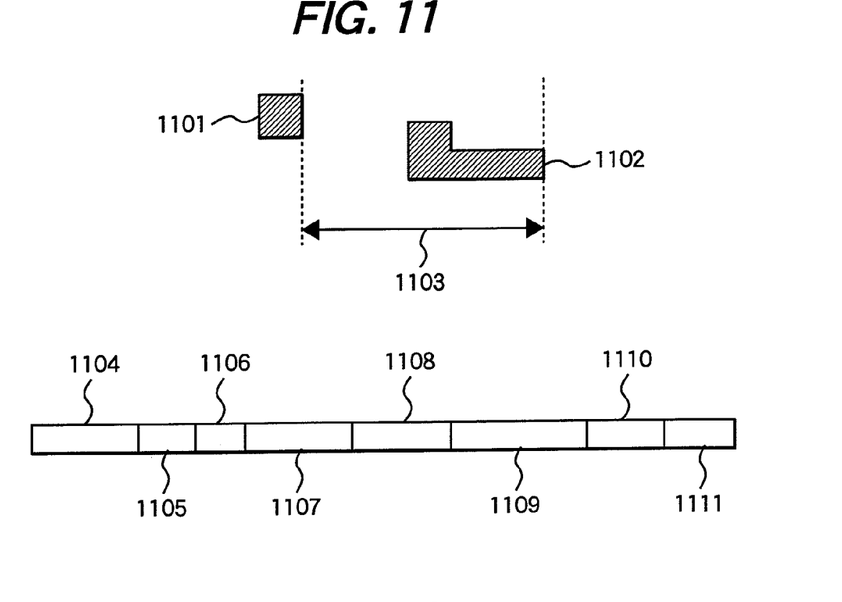
FIG. 11 is a diagram showing a third embodiment of logic cells to which the method for designing cell layout of semiconductor integrated circuit concerning the present invention is applied.

FIG. 11 is a diagram showing logic cells to which the method for designing cell layout of semiconductor integrated circuit according to the present invention is applied. Logic cells to be used as examples include an arranged logic cell 1101, an obstacle 1102, and priority cells to be arranged 1104, 1105, 1106, 1107, 1108, 1109, 1110, and 1111. In order to perform layout processing in consideration of a data flow, it is necessary to arrange the priority cells to be arranged so that 1105 comes next to 1104, 1106 next to 1105, 1107 next to 1106, 1108 next to 1107, 1109 next to 1108, 1110 next to 1109, and 1111 next to 1110. Furthermore, a distance 1103 is a limit of layout area width specified by the control parameter.

Figure 12:
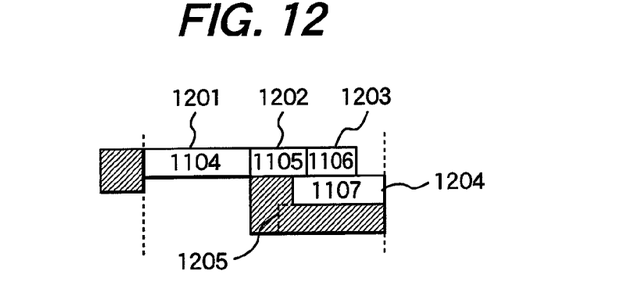
FIG. 12 is a diagram showing a condition in which priority cells are arranged.

FIG. 12 is a diagram showing that suitable layout is possible if priority cells cannot be arranged based on the processing flow shown in FIG. 2 by use of the method for designing cell layout of semiconductor integrated circuit according to the present invention because there is an obstacle. The priority cells 1104, 1105, 1106, and 1107 have already been arranged at positions 1201, 1202, 1203, and 1204, respectively. Step 205 compares the total of the cell width of the cell 1108 and arranged area width with the limit of layout area width. Here, since the limit of layout area width 1103 is smaller than the total, the process proceeds to Step 210. Then, Step 210 determines whether the priority cell 1108 can be arranged at the target layout position. Here, since the cell can be arranged only at a position 1205 because of the obstacle 1102, the process proceeds to Step 206. After Step 206 has been executed, the position 1205 becomes a target layout position. Then, Step 207 determines whether the cell can be arranged at the target layout position 1205. Here, since the cell cannot be arranged because of the obstacle 1102, the process proceeds to Step 209. Step 209 cuts off the arranged priority cells up to the position 1202 at which a layout option exists, i.e., the priority cells 1107, 1106, and 1105 arranged at positions 1204, 1203, and 1202, respectively.

Figure 13:
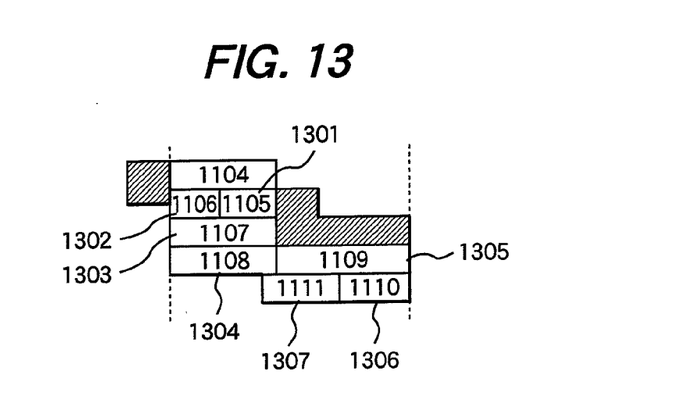
FIG. 13 is a diagram showing a condition in which priority cells are arranged.

FIG. 13 is a diagram showing a result of layout processing performed after the priority cells shown in FIG. 12 have been cut off. Specifically, the process proceeds to Step 203 which arranges the cut off priority cell 1105 at a remaining position 1301 at which a layout option exists. Subsequently, the priority cell 1106 is arranged at a position 1302, and the priority cell 1107 at a position 1303. Then, by arranging the priority cells 1108, 1109, 1110, and 1111 at positions 1304, 1305, 1306, and 1307, respectively, in the same manner as Embodiment 1, it is possible to perform layout processing in consideration of a data flow even if there is an obstacle.

Figure 14:
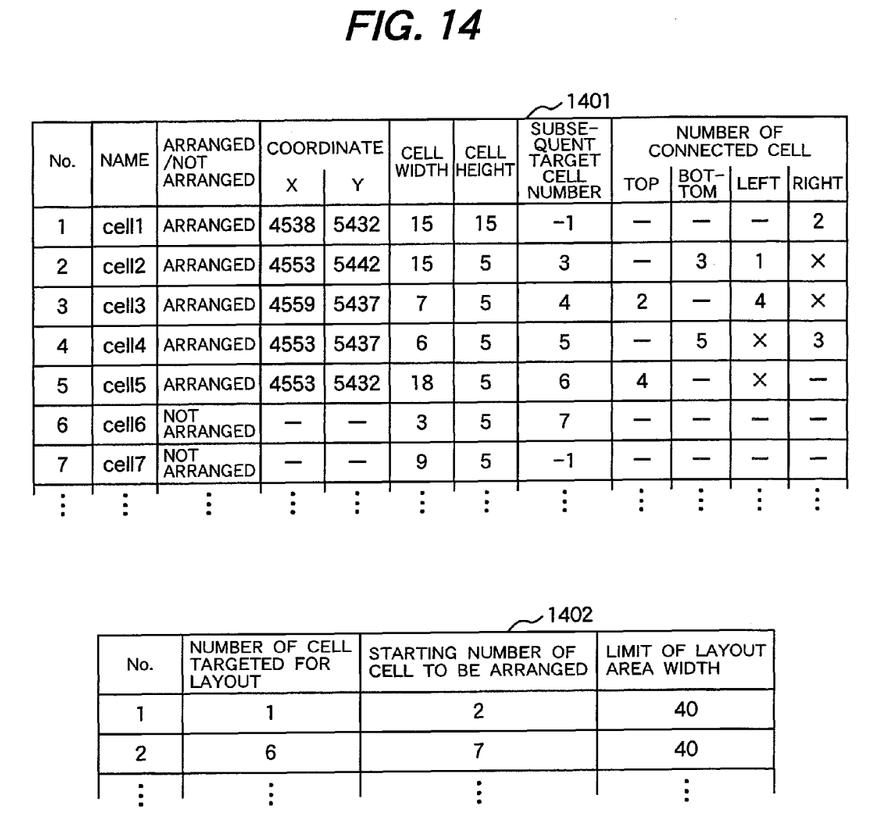
FIG. 14 is a diagram showing an information management method of the present invention.

FIG. 14 is a diagram showing a method for managing information created with the method for designing cell layout of semiconductor integrated circuit according to the present invention. The data input processing unit 101 shown in FIG. 1 sets the cell name, cell width, cell height, and coordinate X and coordinate Y (in the case where the cell has been arranged) in the cell information table 1401 from the logic file 106, the library 108, and the cell layout information 110. Then, the data input processing unit 101 creates a priority cell information table 1402 and information of the subsequent target cell in the cell information table 1401 based on the priority cell information 107 shown in FIG. 1. The priority cell information table 1402 stores numbers of cells targeted for layout, starting numbers of cells to be arranged which are used to sequentially store cells to be arranged, and limit of layout area width. For cells arranged by the priority cell layout unit 102 and the cell layout unit 103, information about whether a cell has been arranged or not, layout coordinate information, and numbers of connected cells are stored in the cell information table 1401. Sequential layout of a plurality of priority cells to be arranged in one cell targeted for layout can be performed by sequentially tracing the target cell numbers in the cell information table 1401. Furthermore, the number of connected cell in the cell information table 1401 is information indicating how priority cells, or a priority cell and a cell to be arranged, are adjacently arranged and whether or not the cells have been searched. In this example, "cell1" (No. 1) is a layout target and the target X direction of layout is the right. A symbol "-" in the field of numbers of connected cells indicates a direction in which a cell has not yet been searched. A symbol "x" in the same field indicates one of four cases: an arranged cell exists; the cell at the relevant position was cut off in Step 209; the area is defined in the floor plan information 105 as an area in which a cell cannot be arranged; and the area is incompatible with the limit of layout area width stored in the storage area referenced in Step 205.

Figure 15:
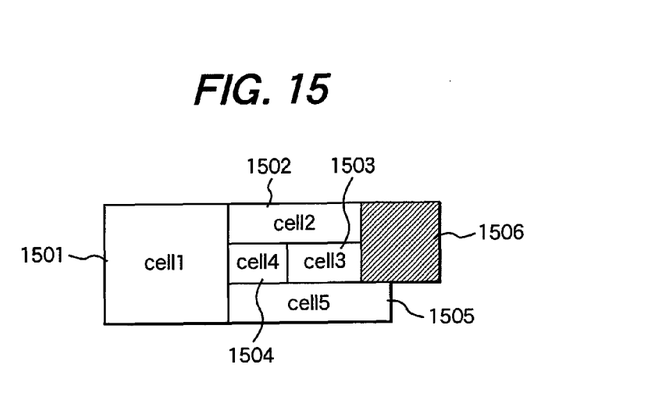
FIG. 15 is a diagram showing a condition in which priority cells are arranged.

FIG. 15 shows a part of data stored in the cell information table 1401 and the priority cell information table 1402 shown in FIG. 14. A cell 1501 targeted for layout, and priority cells 1502 to 1505 have been arranged, which respectively represent "Cell1" to "Cell5" in the cell information table 1401. Furthermore, there is a layout-prohibited area 1506. The cell 1501 targeted for layout is stored as No. 1 in the cell information table 1401 and No. 1 in the priority cell information table 1402. The cell information table 1401 can be traced back from No. 1 in the priority cell information table 1402. A cell to be arranged for the cell 1501 targeted for layout stores the starting number of cell to be arranged in the cell information table 1402 for the starting cell in the layout order, allowing the priority cell 1502 to be traced back. Furthermore, a cell to be arranged for a cell targeted for layout can be extracted by tracing back the subsequent target cell number in the cell information table 1401 from the starting number of cell to be arranged in the priority cell information table 1402. Thus, priority cells 1502 to 1505 can be extracted. When layout processing of a priority cell is performed, information is added to the field of numbers of connected cells, which stores a direction in which a cell has not yet been searched, a layout-prohibited direction, and adjacent cell numbers. A layout-prohibited direction is given to the right of the priority cells 1502 and 1503 and to the left of the priority cells 1504 and 1505. Furthermore, since the cell 1501 connects to the cell 1502, 1502 to 1503, 1503 to 1504, and 1504 to 1505, a cell number is given to each individual connecting direction of these cells.

What is claimed is:

1. A method for designing a cell layout of a semiconductor integrated circuit, comprising the steps of:
    inputting information from information files storing the information, the information including a floor plan of the semiconductor integrated circuit with a logic circuit, arranged cells and a cell layout-prohibited area which have been predetermined based on the floor plan, priority cells constrained by the circuit performance of the logic circuit which are a group of cells chosen from a plurality of cells whose arrangement order is determined in consideration of a data flow in the logic circuit and which are other than the arranged cells, general cells other than the arranged cells and the priority cells, and a limit of a cell layout width which determines a layout range of the priority cells;
    extracting cells which have been already arranged in a direction in which the priority cell is to be arranged, or a cell layout-prohibited area;
    arranging the priority cell in a layout area determined by the limit of the cell layout width using a first algorithm, avoiding the extracted arranged cell or cell layout-prohibited area;
    arranging the general cells using a second algorithm after completion of the arrangement of the priority cells; and
    outputting a layout result of each of the priority cells and the general cells;
    wherein, when any one cell chosen from the priority cells is referred to as a first priority cell and a cell connected with the first priority cell as a second priority cell, the first algorithm performs a cell layout so that at least a part of one side of the first priority cell is in contact with at least a part of one side of the second priority cell; and
    the second algorithm performs compaction so that a cell density of an area where the general cells are arranged is high.

2. The method for designing a cell layout according to claim 1, wherein the first algorithm comprises the steps of:
    arranging a priority cell to be arranged in a first direction on the basis of a target layout position given to the arranged cell;
    repetitively performing a layout operation for connecting a priority cell to be arranged following the priority cell to be arranged with the priority cell to be arranged; and
    comparing a coordinate of a priority cell edge determined by the total of widths of each of priority cells already arranged with a coordinate of the limit of the layout area width determined by the limit of the cell layout width each time the layout operation is repeated.

3. The method for designing a cell layout according to claim 2,
    wherein, when the coordinate of the priority cell edge exceeds the coordinate of the limit of the layout area width, a last arranged priority cell is shifted by one cell row with respect to an arranged priority cell layout row; a priority cell to be arranged is arranged in a second direction which is an opposite direction of the first direction using the coordinate of the limit of the layout area width as a starting point; and an operation is performed for repetitively arranging a priority cell to be arranged following the priority cell to be arranged.

4. The method for designing a cell layout according to claim 2,
    wherein, when the coordinate of the arranged cell is reached before the coordinate of the limit of the layout area width is reached, a last arranged priority cell is shifted by one cell row with respect to an arranged priority cell layout row; a priority cell to be arranged is arranged in a second direction which is an opposite direction of the first direction using the coordinate of the arranged cell as a starting point; and an operation is performed for repetitively arranging a priority cell to be arranged following the priority cell to be arranged.

5. The method for designing a cell layout according to claim 2,
    wherein, when an arranged logic cell or the cell layout-prohibited area is reached before another arranged logic cell used as a reference cell is reached, priority cells already arranged between a priority cell having a plurality of options enabling a cell layout and the coordinate of the limit of the layout area width are cut off; the priority cell is shifted by one cell row with respect to an arranged priority cell layout row; a priority cell to be arranged is arranged in a second direction which is an opposite direction of the first direction using the priority cell having the option as a starting point; and an operation is performed for repetitively arranging a priority cell to be arranged following the priority cell to be arranged.

6. The method for designing a cell layout according to any one of claims 3 to 5,
    wherein, when a sequential layout in the second direction is repeated and if the cell edge coordinate of the priority cell reaches or exceeds the coordinate of the arranged cell which is the starting point, an operation is performed for repetitively arranging in the first direction a priority cell to be arranged following the priority cell to be arranged.

* * * * *